United States Patent [19]

Dusclaux et al.

[11] Patent Number: 4,901,038
[45] Date of Patent: Feb. 13, 1990

[54] LOW-NOISE OSCILLATOR USING SUPERCONDUCTING NONLINEAR ELEMENT

[75] Inventors: Didier Dusclaux, Paris; Jean-Claude Mage, Levallois Perret, both of France

[73] Assignee: Thomson CSF, Paris, France

[21] Appl. No.: 292,164

[22] Filed: Dec. 30, 1988

[30] Foreign Application Priority Data

Dec. 30, 1987 [FR] France .................................. 8718370

[51] Int. Cl.[4] ............................................. H03B 5/08
[52] U.S. Cl. .................................. 331/167; 331/107 S; 505/853
[58] Field of Search ................. 331/107 S, 117 R, 167; 505/853, 854

[56] References Cited

U.S. PATENT DOCUMENTS 2,725,474 11/1955 Ericsson ...................... 331/107 S

FOREIGN PATENT DOCUMENTS 1417634 10/1965 France .

OTHER PUBLICATIONS

Journal of Applied Physics, vol. 45, No. 11, Nov. 1974, pp. 5043-5049, American Institute of Physics, New York U.S.; J. W. Baker et al.: "Effects of A Nonuniform Current Distribution on the Kinetic Inductance of a Thin Super-Conducting Film".

Stein, "Application of Superconductivity to Precision Oscillators", Conference Proceedings of the 29th Annual Frequency Control Symposium, Fort Monmouth, N.J., May 29-30, 1975, pp. 321-327.

*Primary Examiner*—Siegfried H. Grimm
*Attorney, Agent, or Firm*—Cushman, Darby & Cushman

[57] ABSTRACT

A low-noise oscillator includes a resonator constituted by a coil, a capacitor and a sustaining coil which are made of superconductivity material and maintained at a low temperature below the critical temperature; a linear amplifier which always operates in its linear zone; and a load.

The amplitude of oscillation is stabilized when it has attained a threshold value such that the superconducting material constituting the coil of the resonator becomes progressively resistive under the action of the magnetic field produced by this coil. The coil then dissipates part of the energy injected into the resonator. Since the high-frequency noise of the oscillator is essentially determined by the low-frequency noise of its nonlinear element, the use of superconducting material at low temperature in order to constitute the nonlinear element makes it possible to obtain an oscillator having very low noise.

6 Claims, 1 Drawing Sheet

LOW-NOISE OSCILLATOR USING SUPERCONDUCTING NONLINEAR ELEMENT

BACKGROUND OF THE INVENTION

1. Field of the Invention

This invention relates to an oscillator which has low noise and in particular low phase noise in the vicinity of the center frequency.

2. Description of the Prior Art

A conventional oscillator comprises a resonator constituted for example by an inductance coil and a capacitor, an amplifier, and a non-linear element. The amplifier excites the resonator by supplying it with energy. Part of the energy stored in the resonator is collected so as to be applied to the input of the amplifier. The power delivered by the output of the amplifier is higher than the sum of the power dissipated by Joule effect within the resonator and of the power applied to the input of the ampliier. The amplitude of the output voltage of the amplifier would therefore increase indefinitely if provision were not made in said loop for a nonlinear element which reduces the gain of the loop when the amplitude of said voltage increases. The nonlinear element of the oscillator is therefore essential to ensure stable oscillation. The nonlinear element is often constituted by the amplifier itself since it becomes nonlinear when it saturates.

The modelization of an oscillator of this type is described by:

Leeson in "Simple model of a feedback oscillator noise spectrum" Proc. IEEE Vol. 54, Feb. 1966;

H. J. Siweris, B. Chiek in "Analysis of noise up conversion in microwave FET oscillators" IEEE Trans MTT, vol MTT-33 pp 233–242, Mar. 1985.

This modelization serves to show that the noise in the vicinity of the center frequency in this type of oscillator is essentially due to conversion of the low-frequency noise of the amplifier to high-frequency noise by a reversal effect caused by non-linearity of operation of the amplifier. Since the amplifier is usually a semiconductor device having relatively high noise at low frequencies, this type of oscillator has relatively high phase noise.

It is known to reduce the noise of an oscillator by making use of a resonator having a very high quality factor. This solution, however, is often complex and costly. Furthermore, it is not practicable in the case of a voltage-controlled oscillator since an oscillator of this type has a variable-capacitance diode which damps the resonator.

As disclosed by M. Mamodaly, M. Prigent, J. Obregon in "New configurations to reduce converted FM noise in FET oscillators", it is already known to separate the nonlinear element and the amplifier in order to reduce the noise of this type of oscillator. A nonlinear element as provided in a known device comprises two diodes connected in top-to-tail relation in parallel with the resonator in order to limit the voltage at the terminals of the resonator.

Another known device comprises a linear amplifier and a device for automatically controlling the gain of said amplifier, thereby permitting automatic adjustment of gain so as to provide exact compensation for losses in the other elements of the oscillator, especially the resonator, while maintaining the amplifier in a linear operating zone. These two known devices serve to provide an oscillator having lower noise than the conventional oscillator which makes use of the amplifier as an amplitude limiter. However, this reduction of noise is still insufficient for certain applications and inapplicable in some instances.

SUMMARY OF THE INVENTION

The aim of the invention is therefore to propose an oscillator having lower noise than known devices for the same quality of the resonator. The object of the invention is an oscillator comprising a nonlinear element which makes use of the transition properties which are inherent in superconducting materials. In fact, a transition from the superconducting state to the resistive state under the action of a temperature rise or under the action of a magnetic field or under the action of an electric current makes it possible to realize the nonlinear element which is necessary to stabilize the amplitude of an oscillator. Since the superconducting material is employed at low temperature, it introduces little noise in the oscillation since the noise decreases very rapidly as a function of temperature.

In accordance with the invention, a low-noise oscillator comprises a resonator, a linear amplifier and a nonlinear element composed of superconducting material maintained at low temperature under conditions which are close to the transition between the superconducting state and the resistive state.

DESCRIPTION OF THE PREFERRED EMBODIMENTS

Figure 1:
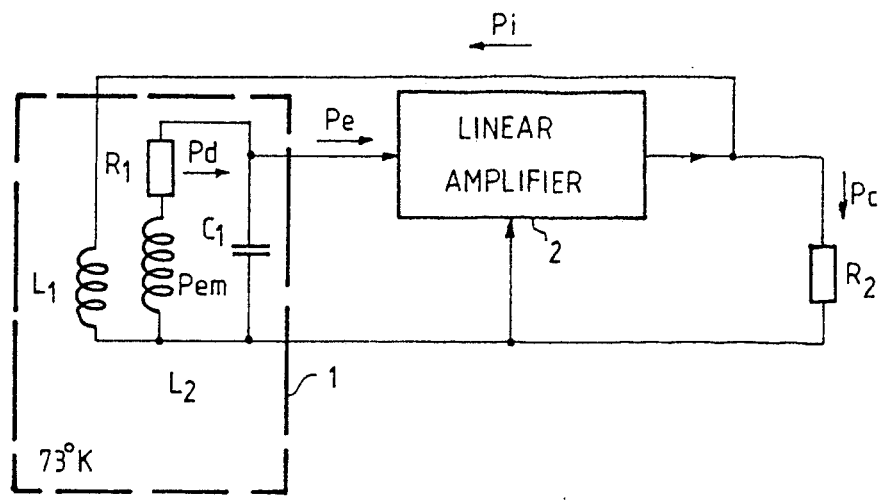
FIG. 1 is a schematic diagram of a first alternative embodiment of the oscillator in accordance with the invention.

Superconducting material through which a direct current passes has a resistivity which falls to zero:
if the temperature of the material is lower than a critical temperature which is characteristic of the material;
if the current density within the material is lower than a critical density;
and if the magnetic field within the material is lower than a critical field.

When an alternating current is passed through superconducting material, its resistance does not fall completely to zero but tends towards a value which is considerably lower (by several orders of magnitude) than the resistance of the same material at room temperature. This variation in resistivity can therefore be induced by modifying either the temperature or the current density or the magnetic field. The last two parameters are related and permit a very rapid variation in resistance over a period which is measured in nanoseconds. Changeover from the practically nonresistive state to the resistive state under the action of the magnetic field or of the current density will be designated hereinafter as electrical switching. Changeover under the action of a variation in temperature is referred-to hereinafter as thermal switching. This latter has a much longer time-duration which can be 1 microsecond or 1 second, depending on the mode of construction of the nonlinear device and on the cooling means which determine its temperature. The three types of changeover are not totally independent since the flow of a current produces action by its Joule effect and at the same time by its current density and its magnetic field.

It is possible to switch superconducting material in accordance with one of these three types of changeover by suitably choosing the mode of fabrication of the nonlinear element and its mode of cooling. The current density produced by oscillation within the material can be brought to the vicinity of the critical density by suitably choosing the cross-section of the material. The magnetic field produced by the oscillation current within the material can be brought to the vicinity of the critical field by giving a suitable shape to the material. In both cases mentioned above, the temperature of the material is maintained below the critical temperature.

In the case of thermal switching, the operating temperature is established at a value slightly below the critical temperature and thermal switching is possible if the heat exchanges with the cooling device are small. To this end, it is advisable to employ a flow of gas and not of liquid as coolant.

The choice of the type of changeover depends on the frequency of the oscillator. Fast changeover relative to the frequency of oscillation acts as a peak limiter and therefore generates harmonics which may be undesirable. On the other hand, with slow changeover, the effect of limitation of the amplitude of oscillation is distributed over numerous periods of oscillation and therefore causes few distortions of the oscillation.

It is therefore possible to employ thermal switching by cooling the superconducting material with a gas flow having a temperature slightly below the critical temperature and by choosing a composition and shape of material such that it does not operate in the vicinity of the critical density and of the critical field, thus making it possible to obtain low-speed changeover.

In order to obtain electrical switching, which is a fast operation, it is necessary to reduce the cross-section of the superconducting material in order to increase the current density and to cool this material by means of a coolant liquid since a liquid permits faster heat exchanges than is the case when using a gas flow and therefore permits perfect temperature stabilization. Alternatively, the material can be arranged in the form of a coil in order to concentrate within the material the magnetic field produced by the current which passes through the material.

The two examples of construction described hereinafter make use of electrical switching but they could readily be adapted to the use of thermal switching in accordance with the principles mentioned above, particularly with a view to providing a low-frequency oscillator.

In FIG. 1, the first alternative embodiment is an oscillator in which the nonlinear element is constituted by the resonator itself. In fact, this oscillator comprises: a resonator constituted by a coil $L_2$ and a capacitor $C_1$; a linear amplifier 2 which always operates in its linear operating zone; and a coil $L_1$ coupled with the coil $L_2$ in order to sustain the oscillations. The coils $L_1$ and $L_2$ and the capacitor $C_1$ are formed of material which is superconducting up to a temperature of 90° K. They are maintained at a temperature of 73° K. by an enclosure 1 filled with liquid nitrogen. One input of the amplifier 2 is connected to a first end of the coil $L_2$ and to a first end of the capacitor $C_1$. A second end of the coil $L_2$ and a second end of the capacitor $C_1$ are connected to a reference potential. A first end of the coil $L_1$ is connected to one output of the amplifier 2 and a second end is connected to the reference potential. The output of the amplifier 2 is also connected to a load $R_2$. Another input of the linear amplifier 2 is connected to the reference potential.

Joule-effect losses within the resonator are represented schematically by a resistor $R_1$ placed in series with the coil $L_2$. Since the coils $L_1$, $L_2$ and the capacitor $C_1$ are maintained at the temperature of the liquid nitrogen, they are far from their critical temperature which is in the vicinity of 90° K. Materials which are superconducting in the vicinity of 90° K. are described for example in "La Recherche", No. 190, July–August 1987, pages 954–959, vol. 18.

Physical Review B, vol. 36 No. 4, Aug. 1st, 1987, page 2301, describes the frequency response of superconducting materials of this type.

The coil $L_2$ has a number of turns such that the magnetic field produced within the superconducting material which constitutes these turns is close to the critical field when the amplitude of oscillations attains the desired value. The desired value is such that the amplifier 2 remains in its linear operating zone. The resonator thus formed performs the function of a nonlinear element which limits the amplitude of oscillations by reason of the fact that, when the magnetic field generated by the coil $L_2$ is higher than the critical field, the superconducting material constituting the coil $L_2$ becomes resistive and dissipates part of the energy stored in the resonator. The power $P_d$ dissipated in the resonator is then an increasing function of the amplitude of oscillation. On the contrary, when the amplitude of oscillation has not yet attained a sufficient value, the magnetic field generated by the coil $L_2$ does not exceed the critical field, there is practically no loss within the resonator and, in consequence, the energy delivered by the output of the amplifier 2 accumulates within the resonator. In this case, the power $P_i$ injected into the resonator is higher than the sum of the power $P_d$ dissipated within the resonator and of the power $P_e$ which is applied to the input of the amplifier 2.

The amplitude of oscillation is stabilized when the injected power $P_i$ is exactly equal to the sum of the dissipated power $P_d$ and of the power $P_e$ applied to the input of the amplifier. Since the amplifier always operates in the linear regime, its low-frequency noise is not converted to high-frequency noise. Only the high-frequency noise of the amplifier contributes to the oscillation noise. So far as the resonator is concerned, its low-frequency noise is converted to high-frequency noise, in particular to phase noise. On account of the low temperature of the resonator, its noise is very low, especially in the low frequencies and the phase noise of the oscillator is therefore very low. This reduction of noise with respect to known devices is independent of the operating frequency of the oscillator. This device accordingly permits the construction of oscillators having low noise and very high frequency.

It is also possible to produce a transition of the material constituting the coil $L_2$ from the superconducting state to the resistive state by reducing the cross-section of the material so as to ensure that the current density is close to the critical density and attains this value when the oscillation has the desired amplitude.

Figure 2:
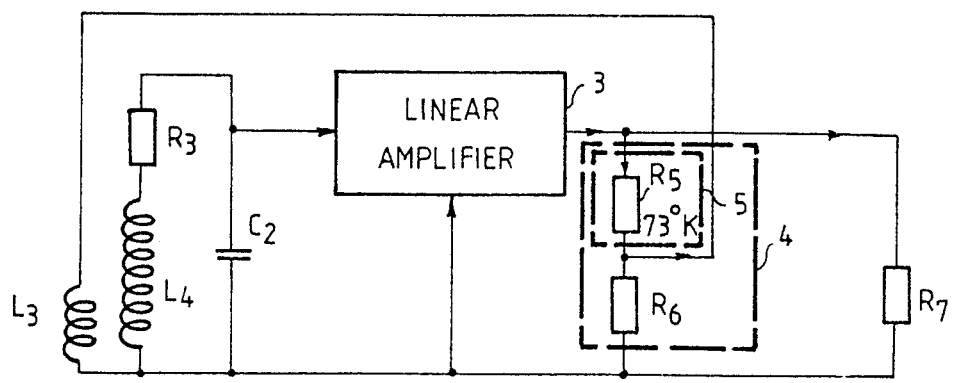
FIG. 2 is a schematic diagram of a second alternative embodiment of the oscillator in accordance with the invention.

FIG. 2 is a schematic diagram showing a second example of construction of the oscillator in accordance with the invention. In this second alternative embodiment, the nonlinear element of the oscillator is a device 4 for automatic control of the loop gain of the oscillator and comprises a nonlinear element formed of superconducting material. In fact, the oscillator comprises: a resonator constituted by a coil $L_4$ and a capacitor $C_2$; a coil $L_3$ for sustaining the oscillations; an amplifier 3 which operates in its linear operating zone; the device 4 for automatic gain control; and a load $R_7$.

A first end of the coil $L_4$ and a first end of the capacitor $C_2$ are connected to one input of the amplifier 3. A second end of the coil $L_4$ and a second end of the capacitor $C_2$ are connected to a reference potential. The losses within the resonator are represented in the diagram by a resistor $R_3$ interposed in series with the coil $L_4$. The sustaining coil $L_3$ has a first end connected to one output of the device 4 and a second end connected to the reference potential. Another input of the amplifier 3 is connected to the reference potential. The output of the amplifier 3 is connected to one input of the device 4 and to one end of the load $R_7$. A second end of the load $R_7$ and one input of the device 4 are also connected to the reference potential.

The device 4 is an attenuator constituted by two resistors $R_5$ and $R_6$, $R_6$ being a conventional resistor placed at room temperature whereas $R_5$ is a resistor formed of material which is superconducting up to a temperature of approximately 90° K. Said material is maintained at a temperature below this critical temperature since the resistor $R_5$ is placed within a thermostatic enclosure 5 at the temperature of liquid nitrogen, namely 73° K. A first end of the resistor $R_5$ and a first end of the resistor $R_6$ are connected together and constitute the output of the device 4. A second end of the resistor $R_5$ and a second end of the resistor $R_6$ constitute respectively the first and the second input of the device 4.

The composition and shape of the material constituting the resistor $R_5$ are chosen so as to ensure that the magnetic field produced within said material by the current which flows through this latter is close to the critical field when the oscillation attains the desired amplitude. When the amplitude of the oscillations increases, the intensity of the current which flows through the resistors $R_5$ and $R_6$ increases. The magnetic field produced by this current within the materal constituting the resistor $R_5$ increases. When said magnetic field attains the critical field, the material becomes resistive by a progressive transition. The bridge constituted by the resistors $R_5$ and $R_6$ produces practically no attenuation of the voltage delivered by the device 4 to the coil $L_3$ as long as the critical field is not attained. It attenuates the voltage supplied by the device 4 to the coil $L_3$ when the amplitude of oscillations is such that the magnetic field within the material of the resistor $R_5$ exceeds the critical field. The amplitude of oscillation is then stabilized at a value such that the power delivered to the resonator by the device 4 is equal to the sum of the power dissipated within the resistor $R_3$ of the resonator and of the power applied to the input of the amplifier 3.

It is also possible to switch the material under the action of an increase in current density instead of an increase in magnetic field. To this end, the material must be given a cross-section such that the current density is close to the critical density when the oscillation attains the desired amplitude.

In this second alternative embodiment, the amplifier and the resonator operate in the linear regime. Only the low-frequency noise of the automatic gain control device 4 is converted to high-frequency noise and in particular to phase noise. The device 4 has only a single nonlinear element, namely the resistor $R_5$. Apart from the high-frequency noise of the amplifier, the oscillator noise is therefore partly determined by the low-frequency noise of said resistor $R_5$. Since it has a very low temperature, this resistor produces extremely little noise, especially low-frequency noise which is liable to be converted to high-frequency noise at the output of the oscillator. There is therefore a reduction in noise of the oscillator.

The invention is not limited to the two examples of construction described in the foregoing. The resonator can be made up of elements having non-lumped constants, such as lines or cavities. It is within the capacity of those versed in the art to produce any number of alternative forms of construction of the automatic gain control device 4 comprising a non-linear resistor formed of superconducting material.

It is also possible to make the amplitude of oscillation variable by shifting the value of the critical field or of the critical density, in particular by circulating a direct current within the superconducting material which constitutes either the resonator or the resistor $R_5$, respectively in the first and the second alternative embodiment, or alternatively by applying a magnetic field produced by means external to the material.

The invention is applicable to many types of oscillators, in particular to voltage-controlled oscillators comprising a coil, a fixed capacitor, and a variable-capacitance diode. Since the oscillator in accordance with the invention has low noise, it is in fact unnecessary to carry out powerful filtering of the noise, with the result that provision need not be made in the oscillator for any resonator which has a very high quality factor.

What is claimed is:

1. A low-noise oscillator comprising a resonator, a linear amplifier, and a nonlinear element formed of superconducting material maintained at low temperature under conditions in the vicinity of transition between the superconducting state and the resistive state.

2. An oscillator according to claim 1, wherein the superconducting material is placed under conditions such that it changes to the resistive state under the action of a temperature rise when the amplitude of oscillation exceeds a predetermined value, said temperature rise being produced within the material by oscillation of the oscillator.

3. An oscillator according to claim 1, wherein the superconducting material is placed under conditions such that it changes to the resistive state under the action of an increase in current density within the material when the amplitude of oscillation exceeds a predetermined value, said current being produced by oscillation of the oscillator.

4. An oscillator according to claim 1, wherein the superconducting material is placed under conditions such that it changes to the resistive state under the action of an increase in the magnetic field within the material when the amplitude of oscillation exceeds a predetermined value, said field being produced by oscillation of the oscillator.

5. An oscillator according to claim 1, wherein the nonlinear element is constituted by the resonator itself, said resonator being formed of superconducting material.

6. An oscillator according to claim 1, wherein the nonlinear element is a device for automatic control of the gain of the amplifier and comprises a nonlinear resistor formed of superconducting material.

* * * * *